United States Patent [19]

Gordon et al.

[11] Patent Number: 5,043,144

[45] Date of Patent: Aug. 27, 1991

[54] SELF-CENTERING VISE FOR HOLDING A SAMPLE IN A LABORATORY INSTRUMENT CHAMBER

[75] Inventors: Jerome C. Gordon, Shorewood; Warren B. Solom, Plymouth, both of Minn.

[73] Assignee: Honeywell Inc., Minneapolis, Minn.

[21] Appl. No.: 263,214

[22] Filed: Oct. 27, 1988

[51] Int. Cl.⁵ .......................... B01L 9/00; B25B 1/10; B25B 1/24

[52] U.S. Cl. .................................. 422/104; 250/440.1; 250/442.1; 269/242; 269/247; 269/257

[58] Field of Search ................... 422/104; 250/440.1, 250/442.1; 269/242, 247, 257

[56] References Cited

U.S. PATENT DOCUMENTS

| 72,921 | 12/1867 | Shellenbock | 269/242 |
| 3,861,664 | 1/1975 | Durkee | 269/242 |
| 4,559,450 | 12/1985 | Robinson et al. | 250/310 |

FOREIGN PATENT DOCUMENTS 555775 7/1923 France .............................. 269/242

Primary Examiner—Robert J. Warden
Assistant Examiner—Stephanie Blythe
Attorney, Agent, or Firm—Roger W. Jensen

[57] ABSTRACT

A self-centering vise for holding a sample in a laboratory instrument includes a pair of elongated rails, end plates attached to opposite ends of the rails disposing them in side-by-side spaced relationship to define a guide channel having a dovetail shape in cross-section between the rails, a central shaft rotatably mounted to the end plates and extending between the end plates and through the channel, and a pair of jaws mounted on the shaft in the channel between the rails and extending above and laterally of the channel so as to overlie and slidably contact the upper slide surfaces of the rails for holding a sample therebetween upon the rails. The shaft has left hand and right hand externally threaded surfaces defined in tandem relationship to one another, and the jaws have lower portions of dovetail shape in cross-section complementary to the dovetail shape of the guide channel defined between the rails and left hand and right hand internally threaded bores extending therethrough complementary to and intermeshing with the left hand and right hand externally threaded surfaces of the shaft for causing self-centering sliding movement of the jaws toward or away from one another upon selective rotation of the shaft.

14 Claims, 2 Drawing Sheets

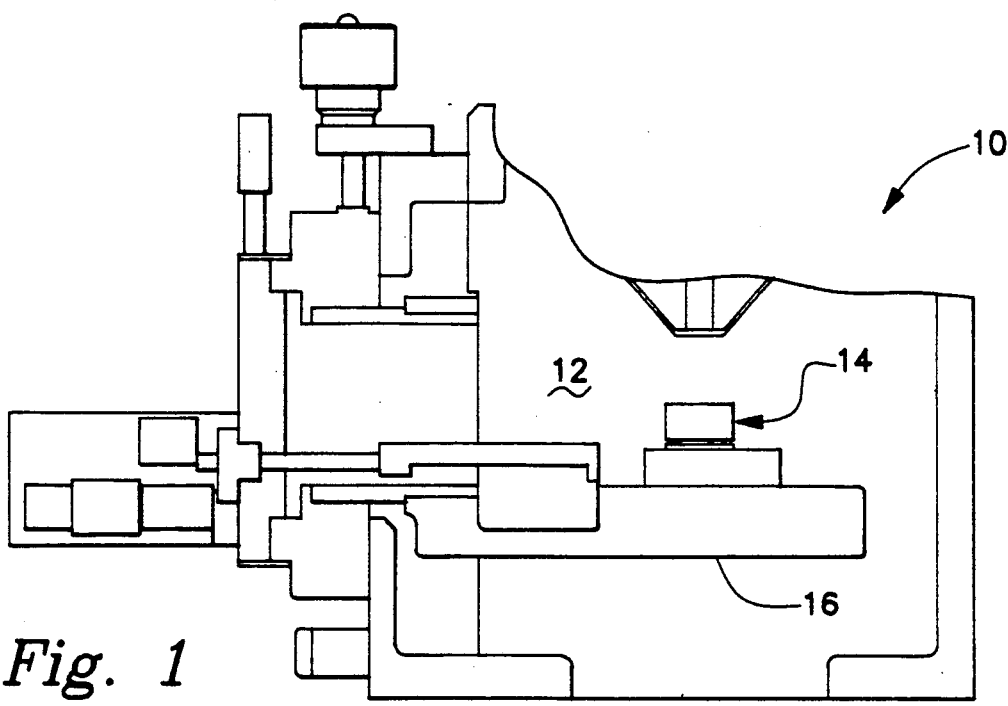
Fig. 1
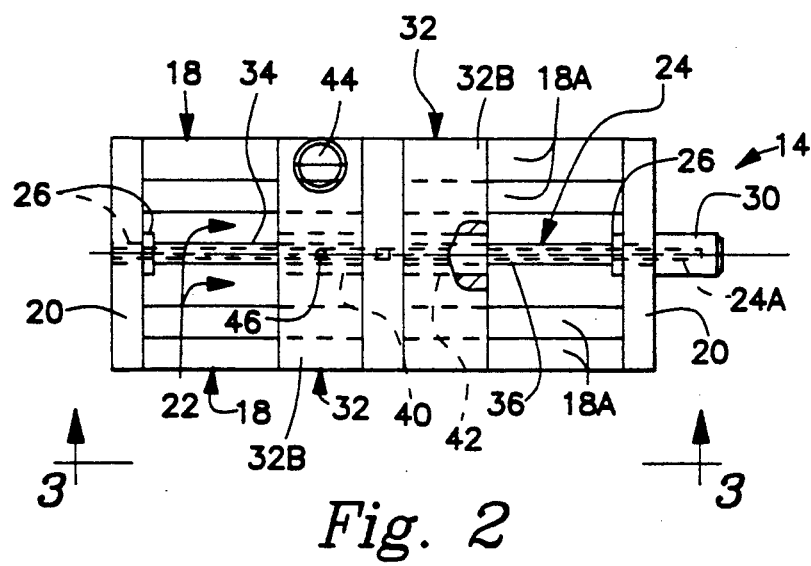
Fig. 2
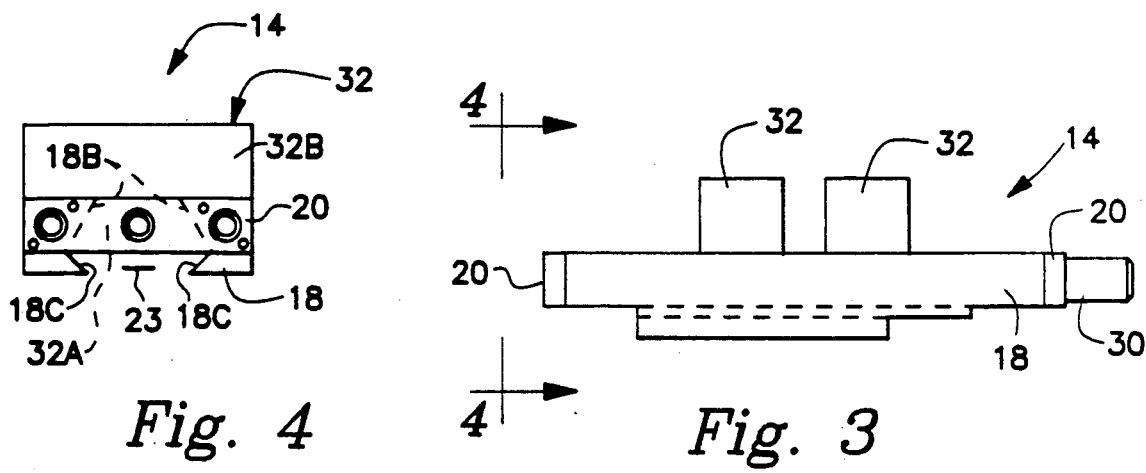
Fig. 4
Fig. 3

SELF-CENTERING VISE FOR HOLDING A SAMPLE IN A LABORATORY INSTRUMENT CHAMBER

BACKGROUND OF THE INVENTION

1. Field of the Invention

The present invention generally relates to devices holding specimens and, more particularly, is concerned with a self-centering vise for holding a specimen in a laboratory instrument, such as a scanning electron microscope.

2. Description of the Prior Art

It is conventional practice to use mechanisms of various designs for holding samples or specimens while they are being examined and analyzed by laboratory instruments. For instance, a holding mechanism must be used to support a sample or part while it is being examined inside the chamber of a scanning electron microscope since the part is completely enclosed within the chamber during the examination.

To allow ease of operation while still maintaining the ability to secure parts of various sizes and shapes, the holding mechanism should have a number of important features. First, the holding mechanism should be self-centering which allows quick installation when loading the instrument and provides the ability to establish the orientation of the part once the instrument is turned on. When the instrument is functioning, the part being analyzed cannot be seen. A cathode ray tube can be seen but is magnified which allows only a small portion of the part to be analyzed at any one time. This can cause disorientation because the entire part is not in view. The self-centering feature will allow returning to a zero X-Y location to regain orientation.

Second, the holding mechanism should have a compact configuration and low profile which allows a part to be examined without the part bumping the top of the instrument. The limited space inside the electron microscope chamber requires efficient use of available altitude when dealing with tall parts. Third the holding mechanism should be lightweight to minimize the load it places on the instrument drive motor so as to allow rotation within the instrument chamber so that different views can be explored.

Fourth, the holding mechanism should utilize materials which avoid contamination that would degrade the high vacuum inside the chamber of the scanning electron microscope. Contaminants such as silicone and petroleum products must not be introduced because chemical analysis data would be altered. Any lubricant used must not volatilize in the high vacuum chamber which would leave a contaminating film in the instrument.

Fifth, because a sample must be electrically conductive and electrically grounded to allow viewing in an electron microscope, the holding mechanism must be a very good electrical conductor.

Sixth, since induced or residual magnetism can deflect the electron beam and cause distortion of the image, the holding mechanism must avoid the use of ferromagnetic materials.

Sample holding mechanisms currently being used fail to incorporate many of the above-outlined features. Consequently, a need exists for a sample holding mechanism incorporating these features to make it particularly suitable for use inside a sealed chamber of a laboratory instrument such as a scanning electron microscope.

SUMMARY OF THE INVENTION

The present invention provides a self-centering vise which incorporates the aforementioned features. The self-centering vise provided for holding a sample in a laboratory instrument, comprises: (a) a pair of elongated rails having opposite ends; (b) means at the opposite ends of the rails for disposing the rails in side-by-side spaced relationship to define a guide channel therebetween; (c) an elongated drive member rotatably mounted to the rail disposing means and extending therebetween and through the channel; and (d) a pair of sample holding members having lower portions mounted on the drive member in the channel between the rails and upper portions extending above and laterally of the channel so as to overlie and slidably contact the rails for holding a sample therebetween. The sample holding members and the drive member have complementary means thereon for causing self-centering sliding movement of the sample holding members toward or away from one another upon selective rotation of the drive member.

More particularly, the guide channel defined between the rails has a dovetail shape in cross-section, and the lower portions of the sample holding members each has a dovetail shape in cross-section complementary to that of the groove. Also, the rail disposing means includes a pair of end plates attached to the opposite ends of the rails and a pair of bushing bearings each disposed in one of the end plates and rotatably mounting one end of the shaft. The respective complementary means on the sample holding members and the drive member are sets of threads disposed in an intermeshing driving relation with one another.

Also, the drive member is a central screw shaft and the sample holding members are a pair of jaws. The complementary means on the shaft are left hand and right hand externally threaded surfaces defined in tandem relationship to one another, whereas the complementary means on the jaws are left hand and right hand internally threaded bores extending through the lower portions of the jaws and being intermeshed with the left hand and right hand externally threaded surfaces of the shaft for causing equidistant self-centering sliding movement of the jaws toward or away from one another upon selective rotation of the shaft.

These and other features and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

In the course of the following detailed description, reference will be made to the attached drawings in which:

FIG. 1 is a fragmentary schematic view of a scanning electron microscope in the chamber of which the self-centering vise of the present invention can be employed.

FIG. 2 is a top plan view of the self-centering vise of the present invention.

FIG. 3 is a side elevational view of the vise as seen along line 3—3 of FIG. 2.

FIG. 4 is an end elevational view of the vise as seen along line 4—4 of FIG. 3.

DETAILED DESCRIPTION OF THE INVENTION

Figure 5:
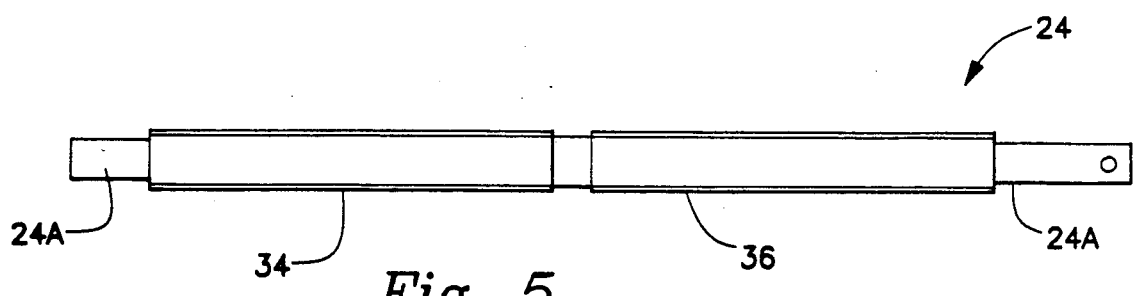
FIG. 5 is an enlarged side elevational view of a central screw drive shaft of the vise of FIG. 2, being illustrated removed therefrom.

Referring now to the drawings, and particularly to FIG. 1, there is shown, in fragmentary schematic form, a laboratory instrument 10 in the form of a scanning electron microscope having an enclosed interior specimen chamber 12 in which a self-centering vise 14, constructed in accordance with the principles of the present invention, can be deployed upon a specimen stage 16 of the instrument to hold a sample for examination and analysis by the instrument. While the vise 14 is illustrated in conjunction with a scanning electron microscope, it should be understood that the vise has general application to other types of instruments for holding specimens or samples. Since the instrument 10 forms no part of the present invention and since an understanding of its operation being well known is not needed herein in order to understand the vise of the present invention, the instrument will not be described any further.

Figure 6:
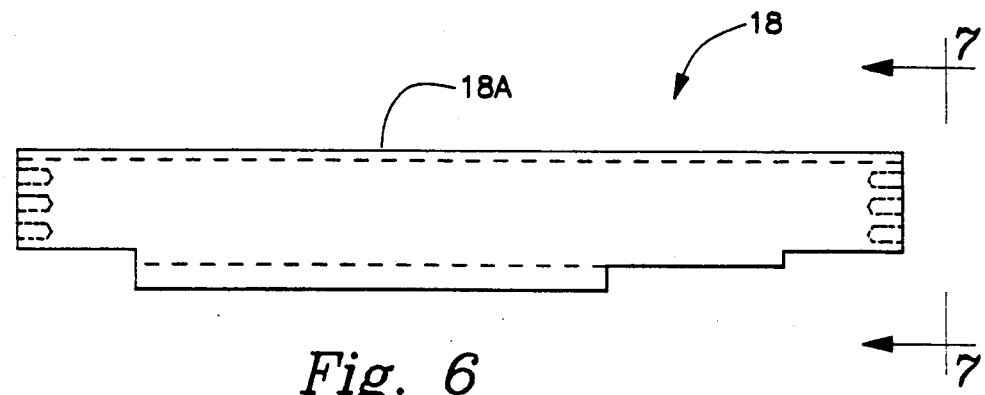
FIG. 6 is an enlarged side elevational view of one of a pair of guide rails of the vise of FIG. 2, being shown removed therefrom.
Figure 8:
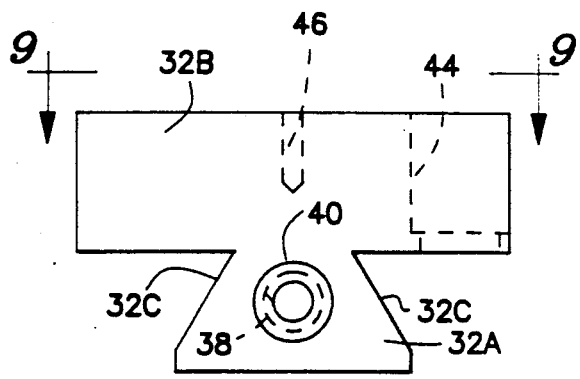
FIG. 8 is an enlarged end elevational view of one of a pair of jaws of the vise of FIG. 2, being shown removed therefrom.
Figure 7:
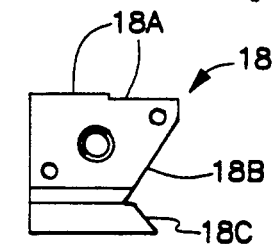
FIG. 7 is an end elevational view of the one guide rail as seen along line 7—7 of FIG. 6.
Figure 9:
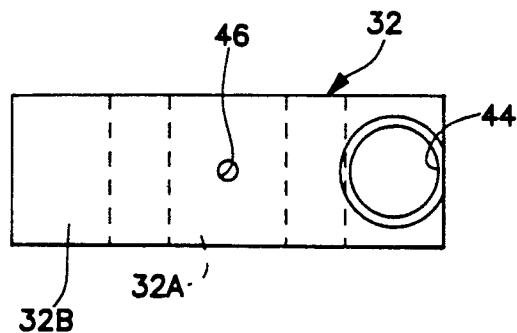
FIG. 9 is a top plan view of the one jaw as seen along line 9—9 of FIG. 8.
Figure 10:
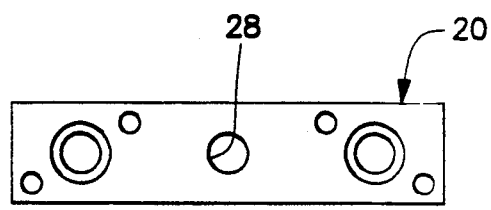
FIG. 10 is an enlarged end view of one of a pair of end plates of the vise of FIG. 2, being illustrated removed therefrom.

Referring now to FIGS. 2-4, the self-centering vise 14 includes includes a pair of elongated rails 18 (see also FIGS. 6 and 7), means in the form of a pair of end plates 20 (see also FIG. 10) attached to opposite ends of the rails 18 and disposing them in side-by-side spaced relationship to define a open guide channel 22 between the rails having a dovetail shape in cross-section. In particular, in addition to their opposite ends, the rails 18 having top slide surfaces 18A and upper inner side surfaces 18B, the latter being oppositely inclined downwardly and outwardly and facing one another to define therebetween the guide channel 22 of the dovetail cross-sectional shape. The rails 18 also have lower inner side surfaces 18C, being oppositely inclined downwardly and inwardly and facing one another to define a mounting channel 23 between the rails 18 of reverse dovetail shape in cross-section, compared to the dovetail shape of the guide channel 22, which allows quick insertion of the vise 14 onto the specimen stage 16 of the instrument 10.

Also, the vise 14 includes a drive member in the form of a central screw shaft 24 (see also FIG. 5) rotatably mounted at its opposite end portions 24A in a pair of lubrication-free bushing bearings 26 fitted in respective central holes 28 in the end plates 20. The screw shaft 24 has an intermediate portion extending along the longitudinal axis A of the vise 14 between the end plates 20 and through the guide channel 22. A knob 30 is attached on the one of the opposite end portions 24A of the shaft 24 which extends outwardly from the corresponding on of the end plates 20. The knob 30 can be gripped to rotate the shaft 24 relative to the end plates 20 and rails 18.

Further, the vise 14 includes a pair of sample holding members in the form of slide jaws 32 mounted on the screw shaft 24 in the guide channel 22 between the rails 18. The jaws 32 have lower portions 32A mounted on the shaft 24 within the channel 22 between the inner side surfaces 18B of the rails 18 and upper portions 32B attached to the lower portions 32A and extending above and laterally of the guide channel 22 so as to overlie and slidably contact the top slide surfaces 18A of the rails 18 for holding a sample therebetween and in a resting position upon the top surfaces 18A of the rails 18. The lower portions 32A of the jaws 32 have outer side surfaces 32C which are oppositely inclined downwardly and outwardly and face away from one another to the jaw lower portions 32A with dovetail cross-sectional shapes being complementary and sized to slidably fit within the dovetail shape of the guide channel 22 defined between the upper inner surfaces 18B of the rails 18.

The shaft 24 and jaws 32 of the vise 14 have respective complementary means thereon being disposed in an intermeshing driving relationship with one another for causing the jaws 32 to move toward and away from one another along the shaft 24 and the rails 18 as the shaft 24 is rotated by the knob 30 thereon. More particularly, the intermediate portion of the shaft 24 has a set of left hand and right hand externally threaded surfaces 34, 36 defined thereon in tandem relationship to one another. The jaws 32 have bores 38 in their lower portions 32A into which are fitted inserts 40, 42 having respective left hand and right hand internal threads which are complementary to and intermesh with the left hand and right hand externally threaded surfaces 34, 36 of the shaft 24. The left and right hand, intermeshed relationships cause equidistant, self-centering sliding movement of the jaws 32 toward or away from one another upon selective rotation of the shaft 24 in one or the other opposite directions.

Also, the left one of the jaws 32 have a pair of large diameter and small diameter bores or recesses 44, 46 defined in its upper portion 32B for receiving calibration standards therein, such as a Faraday cup and a copper pin. Further, the rails 18, end plates 20, shaft 24, bushing bearings 26 and jaws 32 of the vise 14 are composed of electrically conductive materials for rendering the sample held between the jaws 32 electrically conductive. However, all materials are non-ferromagnetic. For example, the rails 18, end plates 20 and jaws 32 are composed of aluminum. Aluminum was selected because it is lightweight, a good electrical conductor, and will not degrade corrosively when touched by human fingers. The bushing bearings 26 are composed of brass and the shaft 24 of stainless steel. If needed, a graphite powder can be used as a lubricant since it will not cause contamination or volatilize in the vacuum chamber 12 of the instrument 10. Graphite is also electrically conductive. The screw shaft 24, as opposed to a spring loaded mechanism, also helps increase the holding force which, in turn, increases the electrical conductivity. The inserts 40, 42 are preferably composed of brass and act as electrical conductors also. As seen in FIG. 4, the dovetail mounting channel of the rails 18, defined between the lower inner side surfaces 18C, extends below the jaws 32 for allowing quick insertion of the vise 14 into the instrument stage 16.

The vise 14 is capable of holding a specimen or sample approximately two inches across compared to only a one inch span in currently available holding mechanisms. It will be realized that when the knob 30 is turned, both vise jaws 32 move toward the center simultaneously. The specimen will thus always be centered so the X axis and Y axis location of the specimen center are known. The self-centering capability of the vise 14 allows returning to a zero X-Y location to regain orientation.

It is thought that the present invention and many of its attendant advantages will be understood from the foregoing description and it will be apparent that various changes may be made in the form, construction and arrangement of the parts thereof without departing from the spirit and scope of the invention or sacrificing all of its material advantages, the form hereinbefore described being merely a preferred or exemplary embodiment thereof.

The embodiments of the invention in which an exclusive property or right is claimed are defined as follows:

1. A self-centering vise for holding a sample in a laboratory instrument, said vise comprising:
   (a) a pair of elongated rails having opposite ends and upper and lower inner surfaces;
   (b) means at said opposite ends of said rail for disposing said rails in side-by-side spaced relationship to define a guide channel between said upper inner surfaces of said rails and a mounting channel between said lower inner surfaces of said rails and below said guide channel for inserting said vise onto the instrument;
   (c) an elongated drive member rotatably mounted at opposite ends to said rail disposing means and extending therebetween within said guide channel and above said mounting channel; and
   (d) a pair of sample holding members having lower portions mounted on said drive member between said rails within said guide channel and above said mounting channel, said sample holding members also having upper portions extending above and laterally of said guide channel so as to overlie and slidably contact said rails for holding a sample therebetween, said sample holding members and said drive member having complementary means thereon for causing self-centering sliding movement of said sample holding members toward or away from one another upon selective rotation of said drive member.

2. The vise of claim 1 wherein said guide channel defined between said rails has a dovetail shape in cross-section.

3. The vise of claim 2 wherein said lower portions of said sample holding members each has a dovetail shape in cross-section complementary to that of said guide channel.

4. The vise of claim 1 wherein said rail disposing means includes:
   a pair of end plates attached to said opposite ends of said rails; and
   a pair of bushing bearings each disposed in one of said end plates and rotatably mounting one end of said drive member.

5. The vise of claim 1 wherein said respective complementary means on said sample holding members and said drive member are disposed in an intermeshing driving relationship with one another.

6. The vise of claim 1 wherein said drive member is a central screw shaft and said complementary means are left hand and right hand externally threaded surfaces defined in tandem relationship to one another on said shaft.

7. The vise of claim 6 wherein said sample holding members are a pair of jaws and said complementary means are left hand and right hand internally threaded inserts extending through said lower portions of said jaws and being intermeshed with said left hand and right hand externally threaded surfaces of said shaft for causing self-centering sliding movement of said jaws toward or away from one another upon selective rotation of said shaft.

8. The vise of claim 1 further comprising a knob attached on one of said opposite ends of said drive member.

9. The vise of claim 1 wherein one of said sample holding members has a bore defined in said upper portion thereof for receiving a calibration standard therein.

10. A self-centering vise for holding a sample in a laboratory instrument, said vise comprising:
    (a) a pair of elongated rails having opposite ends, top slide surfaces, upper inner side surfaces and lower inner side surfaces, said upper inner side surfaces being oppositely inclined downwardly and outwardly and facing one another to define a guide channel of a dovetail shape in cross-section between said rails when said rails are disposed in side-by-side spaced relationship to one another, said lower inner side surfaces being oppositely inclined downwardly and inwardly and facing one another to define a mounting channel of a reverse dovetail shape in cross-section between said rails for insertion of said vise onto said instrument;
    (b) a pair of end plates attached to said opposite ends of said rails so as to disposed said rails in said side-by-side spaced relationship;
    (c) a central shaft having opposite end portions rotatably mounted to said end plates and an intermediate portion extending between said end plates within said guide channel and above said mounting channel, said intermediate shaft portion having left and right hand externally threaded surfaces defined in tandem relationship to one another; and
    (d) a pair of jaws having lower portions mounted on said shaft between said rails within said guide channel and above said mounting channel, said jaws also having upper portions attached to said lower portions and extending above and laterally of said guide channel so as to overlie and slidably contact said upper slide surfaces of said rails for holding a sample therebetween and in a resting position upon said upper sliding surfaces of said rails, said lower portions of said jaws being of a dovetail shape in cross-section complementary to said dovetail shape of said guide channel defined between said rails and having left hand and right hand internally threaded inserts extending therethrough complementary to and intermeshing with said left hand and right hand externally threaded surfaces of said shaft for causing self-centering sliding movement of said jaws toward or away from one another upon rotation of said shaft in one or the other opposite directions.

11. The vise of claim 10 wherein each of said end plates has a bushing bearing composed of an electrically conductive material and disposed therein which rotatably mounts one of said opposite end portions of said shaft.

12. The vise of claim 10 further comprising a knob attached on one of said opposite end portions of said shaft extending outwardly from the corresponding one of said end plates.

13. The vise of claim 10 wherein one of said jaws members has a bore defined in said upper portion thereof for receiving a calibration standard therein.

14. The vise of claim 10 wherein said rails, shaft, end plates and jaws are composed of electrically conductive materials.

* * * * *